United States Patent [19]

Murphy

[11] E Re. 28,653

[45] Reissued Dec. 16, 1975

[54] METHOD OF FABRICATING SEMICONDUCTOR DEVICES

[75] Inventor: Bernard Thomas Murphy, New Providence, N.J.

[73] Assignee: Bell Telephone Laboratories, Incorporated, Murray Hill, N.J.

[22] Filed: Aug. 10, 1972

[21] Appl. No.: 279,701

Related U.S. Patent Documents

Reissue of:

[64] Patent No.: 3,649,386
Issued: Mar. 14, 1972
Appl. No.: 723,529
Filed: Apr. 23, 1968

[52] U.S. Cl. ..... 148/175; 148/187; 357/49; 357/50; 357/56

[51] Int. Cl. ..... H011 7/36; H011 7/50

[58] Field of Search ..... 317/235 E, 235 F, 235 AK; 148/175, 187; 357/49, 50, 56

[56] References Cited

UNITED STATES PATENTS

| | | | |
|---|---|---|---|
| 3,386,865 | 6/1968 | Doo | 317/235 F |
| 3,390,019 | 6/1968 | Manchester | 317/235 AY |
| 3,437,533 | 4/1969 | Dingwall | 148/187 |
| 3,442,011 | 5/1969 | Strieter | 29/578 |
| 3,445,303 | 5/1969 | Engbert | 148/187 |
| 3,461,003 | 8/1969 | Jackson, Jr. | 148/175 |
| 3,479,237 | 11/1969 | Bergh et al. | 317;148/235;187 |
| 3,484,313 | 12/1969 | Tauchi et al. | 148/187 |
| 3,512,054 | 5/1970 | Owada et al. | 317/235 AK |
| 3,519,504 | 7/1970 | Cuomo | 317/235 |
| 3,530,343 | 9/1970 | Irie et al. | 317;148/235;186 |
| 3,534,234 | 10/1970 | Clevenger | 317;148/235;186 |
| 3,550,256 | 12/1970 | Deal | 317/235 |
| 3,615,929 | 10/1971 | Portnoy | 317/235 UA |
| 3,648,125 | 3/1972 | Peltzer | 317/235 R |

FOREIGN PATENTS OR APPLICATIONS

| | | | |
|---|---|---|---|
| 6,614,016 | 4/1968 | Netherlands | 317/235 AK |
| 704,674 | 4/1968 | Belgium | 317/235 AK |
| 826,343 | 10/1969 | Canada | 317/235 AK |

OTHER PUBLICATIONS van Gelder et al., Journal of the Electrochemical Society, "Etching of Silicon Nitride," Vol. 113, No. 12, p. 315C, Dec. 1966.

*Primary Examiner*—William D. Larkins
*Attorney, Agent, or Firm*—G. W. Houseweart; M. J. Urbano

[57] ABSTRACT

The invention is a method of fabricating semiconductor devices which have the uniform avalanche breakdown junctions characteristic of prior art mesa device structures while retaining the desirable passivation and overlay contact features characteristic of planar structures. An important feature is based on the fact that the bulk increases when silicon is converted to the oxide whereby depressions in a silicon body can be filled by selective oxidation of the regions of the depressions.

5 Claims, 8 Drawing Figures

METHOD OF FABRICATING SEMICONDUCTOR DEVICES

Matter enclosed in heavy brackets [ ] appears in the original patent but forms no part of this reissue specification; matter printed in italics indicates the additions made by reissue.

BACKGROUND OF THE INVENTION

(1) Field of the invention

This invention relates to the fabrication of semiconductor devices, and more particularly relates to a method for filling depressions in a semiconductive body by selectively oxidizing regions of the depression.

The invention has special application to the class of devices having a junction to be operated in avalanche breakdown. This class includes avalanche photodiodes, PNPN diodes, avalanche transistors, and IMPATT diodes. IMPATT, an acronym for the [phase] *phrase* IMPact Avalanche and Transit Time, is a generic name applied to devices which employ the avalanche and transit time properties of semiconductor structures to produce negative conductance at microwave and millimeter wave frequencies. This negative conductance is employed in microwave amplifiers and oscillators and represents a powerful solid state source of high frequency microwave power. It will be convenient to describe this invention specifically in terms of the IMPATT diode.

(2) Description of the prior art

Semiconductor devices fabricated according to the widely used planar process have certain advantages including ease of interconnection of devices by means of overly contacts and including passivation against contamination that would tend to deleteriously affect device characteristics. Highly characteristic of the planar process is the diffusion of impurities through a mask to form a PN junction comprising a plane central portion and a curved surrounding edge portion which intersects the surface. The geometry of such a junction favors the occurrence of avalanche breakdown at either the surface or at the curved edge of the junction. Unfortunately, such breakdown is generally less desirable than breakdown in the bulk over the larger area central plane portion of the junction.

Various techniques have been suggested to ensure bulk rather than surface or edge breakdown.

One class of such techniques confines itself substantially to the conventional planar process. Typical of this class is the method described in U.S. Pat. 3,345,211, issued Oct. 3, 1967. In that process the resistivity of the semiconductor material adjoining the edge portions of the junction is adjusted to promote bulk breakdown rather than surface breakdown. A diode fabricated in that way avoids the surface breakdown problem, but there still remains the problem that the curved edge portion of the junction tends to have a lower breakdown than the central planar portion. As a consequence, the breakdown tends to be localized at the relatively small area of the curved edge, thus adding excess resistance to the diode. This is particularly undesirable for a negative conductance device in that series resistance subtracts directly from the available negative resistance.

Another such technique which has been employed to induce uniform breakdown of the central planar portion of the junction is the use of a guard ring which is a low resistivity zone surrounding the surface and edge portions of the junction. However, this approach tends to add excess capacitance and resistance to the diode, both of which limit the available output power and high frequency response.

One way to avoid breakdown at the curved edge of a planar junction is to abandon the planar structure and revert to the old mesa structure such as is depicted in the U.S. Pat. 3,067,485 to D. F. Ciccolella et al., issued Dec. 11, 1962. However, mesa structures of the prior art have two distinct disadvantages. One is the lack of adequate junction passivation which causes surface breakdown where the junction comes to the sidewalls of the mesa. A second disadvantage is the obvious difficulty of interconnecting elements, such as to form an integrated circuit.

Accordingly, an object of the present invention is a semiconductor devices containing an avalance junction which avoids the tendency to edge or surface breakdown without sacrificing efficiency and high speed of response.

A further object of this invention is a semiconductor structure having the desirable avalanche breakdown properties of the older mesa structures while retaining the passivation and overlay contact features of planar structures.

A broad object of the invention is a method for selectively filling depressions in a semiconductive body.

Another broad object of the invention is a method for forming a mesa of epitaxially grown semiconductive material over a bulk portion of semiconductor material, with the mesa laterally surrounded by a grown genetic oxide of the epitaxial semiconductive material in such a manner that the surface of the grown genetic oxide is substantially coplanar with the surface of the mesa.

SUMMARY OF THE INVENTION

To these ends, the present invention provides a process for the convenient fabrication of a semiconductor structure which includes a mesa-like semiconductor portion within a plane surface on which overlay contacts may be formed.

In one aspect an important feature of the method of this invention is the use of a multirole mask on a semiconductor surface. In one step the mask protects a portion of the semiconductor surface while the unmasked portions are partially etched away. In another step the same mask prevents oxidation of the protected portion of the semiconductor surface while the previously etched portions are oxidized. Subsequently the mask is removed in a solution which does not attack the oxide or the semiconductor surface.

Another important feature of the method of this invention is that use is made of the fact that during the thermal oxidation of silicon approximately 1,000 angstroms of silicon oxide is formed for every 440 angstroms of silicon depleted. That is, selective thermal oxidation is employed to fill depressions in a silicon surface.

As will be apparent from the detailed description set forth hereinbelow, an important first step in accordance with this invention is the forming on the surface of the expitaxial layer of a body which includes a semiconductive epitaxial layer on a semiconductive bulk portion a first mask of a material having the characteristics that it resists etching in an ambient which etches the semiconductor material and that it inhibits oxidation of the underlying semiconductor material during a subsequent step in which the unmasked portion of the surface is oxidized and that it is removable by etching in still another ambient which attacks the mask but does not appreciably attack the grown oxide of the semiconductor material. After the mask is formed, the body is immersed in an ambient which etches the unmasked portions of the surface of the epitaxial layer but does not attack the mask, the etching being allowed to proceed until the unmasked portions of the surface of the epitaxial layer are etched at least partially through the epitaxial layer to form a mesa. Thereafter, and without removing the mask, the body is exposed at an elevated temperature to a second ambient sufficient to oxidize the unmasked portions of the epitaxial layer and for a time sufficient that the oxide grown there extends essentially completely through the epitaxial layer and planarity thus is substantially restored to the surface of the body. Then the mask is removed from the surface to expose the portions of the surface previously underlying the mask; and impurities are introduced into the now exposed portions of the semiconductor surface to modify the conductivity therein, it being an important advantage of this impurity-introducing step that the aforementioned grown oxide is used as a second mask for enabling selective introduction of impurities into the now exposed semiconductor regions.

In accordance with the preferred embodiment of this invention, the impurities introduced into the exposed semiconductor portions are of a type and amount sufficient to form in the mesa a plane rectifying junction which intersects the sides of the mesa where such sides are covered by the grown genetic oxide.

In a first described embodiment of this invention an IMPATT diode is prepared essentially as follows. A lightly doped N-type layer is formed on a plane surface of a more heavily doped N-type monocrystalline silicon body. Typically, the N-type layer is formed by an epitaxial growth process. Then the portion of the layer which is to define the [idode] *diode* junction area is masked with, for example, silicon nitride, a material having the above-described characteristics, and the unmasked portions of the semiconductor surface are etched to a predetermined depth, thus forming a mesa. Using the fact that, during thermal oxidation, silicon oxide thickness increases faster than the underlying silicon is depleted, the etched regions are then oxidized until they are substantially filled with oxide, thus restoring a substantially plane surface on which overlay contacts may be formed.

Thereafter, the mask is removed from the surface by etching in a solution which attacks the mask but does not attack the surrounding silicon oxide. The final step is a diffusion of impurities into the previously masked portion of the semiconductor material to form therein a thin P-type zone adjacent the surface, thereby forming a plane PN junction extending laterally to the sidewalls of the semiconductive mesa. By diffusing to a depth such that the jucntion intersects the sidewalls of the mesa at a point beneath the surface of the thermally grown oxide, passivation of the junction is achieved.

BRIEF DESCRIPTION OF THE DRAWING

The invention and its further objects and features will be more clearly understood from the following detailed description taken in conjunction with the drawing in which.

It will be understood that although the following process is described in terms of a single element, the steps of the process may be performed upon an entire slice which subsequently is divided into several hundred single elements.

DETAILED DESCRIPTION

Figure 1:
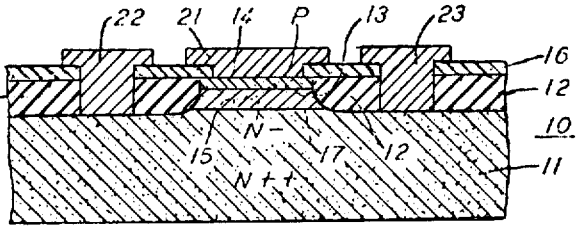
FIG. 1 shows in cross section an IMPATT diode fabricated in accordance with this invention.

In the IMPATT diode 10 depicted in FIG. 1, the monocrystalline silicon body comprises a mesa portion of reduced cross section on a bulk portion 11 of increased cross section. Bulk portion 11 is of low resistivity N-type conductivity while the mesa includes a higher resistivity N-type zone 15 contiguous with the bulk and a shallow P-type surface zone 14 contiguous with zone 15, thereby forming a plane PN junction 13.

The bulk portion surrounding the mesa supports a silicon oxide layer 12 of height such that its upper surface is substantially coplanar with the plane surface of the mesa.

Junction 13 intersects the surface of the body at the sidewalls of the mesa, and so the region of intersection is buried beneath the surface of the silicon oxide, thereby being protected from contamination which would deleteriously affect the junction.

Generally, as will appear below, it will be desirable to form the mesa from a layer which is grown expitaxially. This facilitates achieving the desired high resistivity for layer 15.

A first metal electrode 21 contacts the P-type zone 14 of the diode. A ring contact (not necessarily closed), seen in cross section as metallic regions 22 and 23, contacts the low resistivity N-type substrate 11. To minimize series resistance, zones 22 and 23 are advantageously as close as possible to the mesa, subject only to the provision that the contacts do not in any way interfere with the space charge depletion region associated with junction 13.

It will be noted in FIG. 1 than an optional second insulating layer 16 has been formed over the surface of both the oxide and the semiconductor portions of the IMPATT diode for the purpose of providing further protection against contamination. Layer 16 may be of silicon nitride, aluminum oxide, or zirconium oxide, or of any other material known to provide protection against contamination.

The N-type region 15 is advantageously adjusted in thickness and resistivity such that when junction 13 is reverse-biased, that portion of the space charge depletion region which extends into layer 15 should approach interface 17 between layer 15 and substrate 11 when the electric field in the space charge depletion region is at the threshold of avalanche breakdown.

If avalanche breakdown occurs before region 15 is swept out, both the DC bias current and any AC signal current is forced to flow through part of the relatively high resistivity region 15, thereby adding series resistance to the IMPATT diode and thereby detracting from any negative resistance which is produced.

On the other hand, the space charge region of junction 13 cannot extend significantly beyond interface 17 due to the high density of free charge carriers in substrate 11. It has been found that if avalanche breakdown requires a voltage significantly higher than that voltage necessary to just deplete layer 15 of free charge carriers, the high frequency oscillations can grow in magnitude until the device is thermally destroyed. Though this problem is not well understood, it is avoided by the above-suggested relation between the thickness and resistivity of layer 15.

Figure 2:
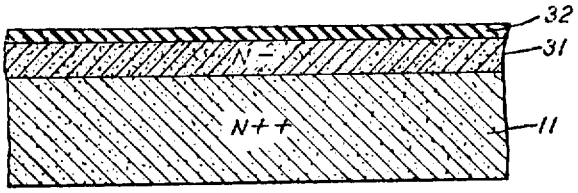
FIGS. 2 through 6 show the IMPATT diode in various stages of its manufacture.

In accordance with the presently described embodiment of the invention, an IMPATT diode of the kind shown in FIG. 1 is fabricated as follows:

Referring to FIG. 2, the starting material is a monocrystalline silicon water 11 having a very heavy concentration of arsenic impurity such that the resistivity is less than about 0.0015 ohm-centimeter. On one surface there is grown, in conventional fashion, a one micron thick epitaxial layer 31 in which arsenic again is the predominant impurity but of lesser concentration such that the resistivity of the epitaxial layer is about 0.05 ohm-centimeter.

A 2000 angstroms thick masking layer 32, for example, of silicon nitride, is then deposited on epitaxial layer 31 by the conventional process including pyrolitic decomposition of an organic silane.

As will become more evident hereinbelow, masking layer 32 serves a multiple function, and as such will advantageously have the following characteristics. It should not be appreciably etched by the ambient (liquid or gaseous) which is to be used subsequently to etch silicon. Further, it should be etched by an ambient which will appreciably etch neither silicon nor silicon oxide. In addition, during subsequent thermal oxidation of the silicon body, layer 32 should prevent oxidation of silicon material covered by that layer. Finally, layer 32 should not form, with the underlying silicon, any alloys, compounds, or mixtures which are not conveniently removed without damaging the surrounding silicon and silicon oxide.

The next processing step is the removal of portions of layer 32 from all regions of the surface of epitaxial layer 31 except those under which a rectifying junction will be subsequently formed. This removal is accomplished, for example, by forming a photoresist film or coating selectively over portions of the layer 32; etching the exposed portions of layer 32 in a solution of phosphoric acid maintained at a temperature of about 180° C; and then dissolving the remaining photoresist in a standard solution intended therefor.

Figure 3:
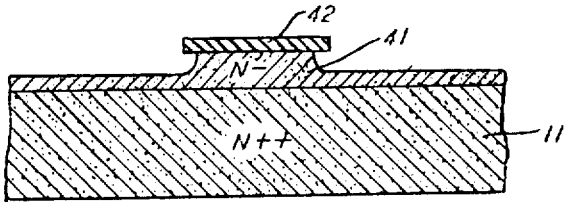

Then by conventional techniques, such as etching in hydrofluoric acid, the now exposed portions of the semiconductor surface are etched for a time sufficient to remove about 70 percent, i.e., about 0.7 micron of epitaxial layer 31. The resulting mesa-like structure is shown in FIG. 3 wherein all but a central portion of the epitaxial layer has been etched leaving the epitaxial zone 41 covered by the silicon nitride mask 42. As depicted, some undercutting typically occurs.

Figure 4:
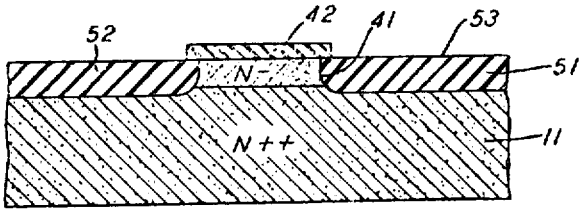

Then, as shown in FIG. 4, thermal oxidation of the entire structure at about 1050° C. in steam for about two hours converts the unprotected portions of epitaxial layer 31 to oxide.

Inasmuch as about 1,000 angstroms of silicon oxide is formed for every 440 angstroms of underlying silicon depleted, the oxidation step is advantageously adjusted such that the formed oxide zones 51 and 52 substantially fill the voids created by the etching and thus restore a substantially planar surface 53, as shown in FIG. 4.

Figure 5:
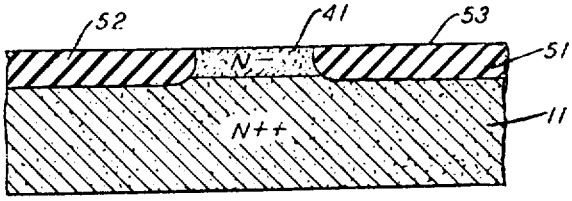

The next step is to remove the silicon nitride mask 41 by immersing the body in a bath of hot (about [80° C] *180° C*) phosphoric acid which does not attack silicon or silicon oxide appreciably, This leaves the structure shown in FIG. 5.

It will be noted from FIG. 5 that all but a central portion of epitaxial layer 31 has been removed, thus leaving a mesa-like structure completely surrounded laterally by a passivating layer of silicon oxide which serves the double purpose of restoring a substantially plane surface and of passivating the sidewalls of the mesa.

The next step takes advantage of the known fact that silicon oxide is an effective mask against the diffusion of boron. The structure shown in FIG. 5 is cleaned in conventional fashion and then placed in a diffusion furnace such that boron is diffused into the exposed surface of the mesa to produce, as shown in FIG. 6, a shallow zone 14 of P-type conductivity having a sheet [resistivilty] *resistivity* of about 500 ohms per square.

Figure 6:
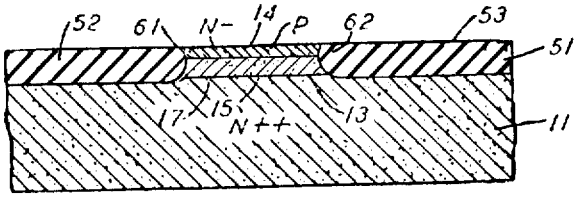

It will be noted in FIG. 6 that PN junction 13, formed between diffused zone 14 and the undiffused remainder of epitaxial zone 15, is substantially planar, i.e., free of curved portions. In addition, junction 13 has been formed at a depth lower than the surface 53 of the oxide zones 51 and 52 so that all points, such as 61 and 62, at which the junction 13 intersects the sidewalls of the mesa are covered and thus passivated by the oxide.

Referring again to FIG. 1, it will be apparent that a variety of arrangements may be adopted for accomlishing actual electrical contact to the semiconductor zones. A particularly advantageous technique includes the use of a beam lead technology such as disclosed in the M. P. Lepselter Pat. 3,335,338, issued Aug. 8, 1967.

Figure 7:
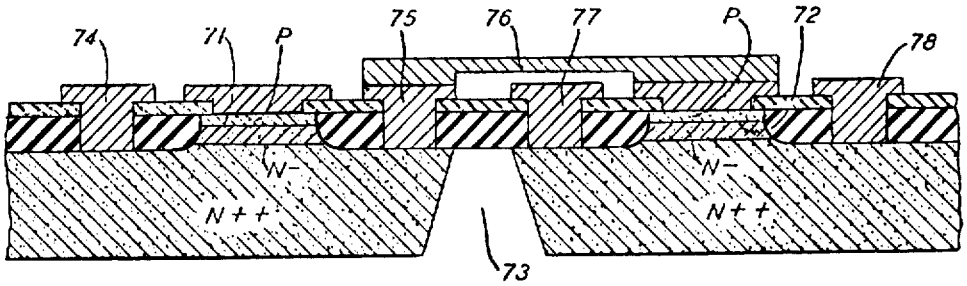
FIG. 7 show a cross section of two diodes connected in series.

Similarly, it will be apparent to those skilled in the semiconductor integrated circuit art that two or more such diodes may be formed and interconnected electrically on a common semiconductor substrate, as shown in FIG. 7.

The two diodes 71 and 72 shown in FIG. 7 each are identical to the diode of FIG. 1. It will be apparent that the two diodes can be formed on a common N-type substrate and then electrically isolated by the removal of semiconductor material, as shown to form air gap 73 and, thus, to leave an air-isolated structure, such as disclosed in the U.S. Pat. 3,335,338 to M.P. Lepselter, issued Aug. 8, 1967.

More particularly, FIG. 7 shows the two identical diodes 71 and 72 connected electrically in series by the relatively thick metallic beam 76 which is attached at the one end to a portion of the ring contact (shown in cross section as zones 74 and 75) to diode 71. The other end of beam 76 is attached to the dot contact to diode 72. Beam 76 is shown crossing over, but not contacting, metallic zone 77 (which is a cross section of the ring contact to diode 72), and, as such, may be advantageously formed by the techniques in U.S. Pat. 3,461,524 issued Aug. 19, 1969 to M. P. Lepselter, and assigned to the same assignee as this application.

Figure 8:
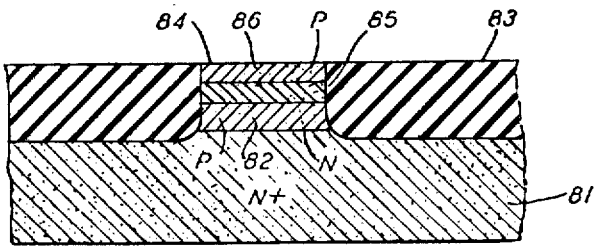
FIG. 8 shows a cross section of a PNPN diode fabricated in accordance with this invention.

Still further, it will be apparent that the method of this invention may be employed to fabricate a diode requiring multiple diffusions such as, for example, the PNPN diode shown in FIG. 8.

Referring to FIG. 8, first, there is formed a monocrystalline substrate 81 of relatively low resistivity N-type conductivity having a thin layer 82 of relatively high resistivity P-type conductivity thereon. A multipurpose mask is employed as described hereinbefore in relation to the first embodiment to enable etching of the surrounding material to form a mesa and then to enable thermal oxidation of the surrounding etched regions to substantially reform a plane surface 83 with the top of the mesa 84. The multipurpose mask is removed and subsequent successive diffusions are employed to form first the N-type zone 85 and then to convert the surface portion of zone 85 to the shallow P-type zone 86. Electric contacts are made to the front and/or the back of the wafer in accordance with conventional techniques.

In addition, the method of this invention may be employed to fabricate an avalanche photodiode simply by forming a structure, such as is described with reference to FIG. 1, with the exception that a transparent or serpentine-type electrode pattern is formed on the surface of the zone above the junction, and a conventional electrode is formed either on the back of the wafer or on the front, such as zones 22 and 23 in FIG. 1. More particular information relating to fabrication of avalanche photodiodes may be found in U.S. Pat. 3,514,846 issued June 2, 1970 to W. T. Lynch, and assigned to the same assignee as this application.

It will be understood that the specific embodiments described are merely illustrative of the general principles of the invention and that various modifications are feasible without departing from the spirit and scope of the invention. That is, the method of this invention is of general applicability for increasing the planarity of a silicon wafer by selective thermal oxidation.

More particularly, it will be evident that the invention may be employed to form passivated plane junctions free of curved edges in other devices, such as avalanche transistors or integrated circuits.

Still further, it will be apparent that materials other than those [sepcifically] *specifically* mentioned obviously may be used instead. For example, aluminum oxide may be used instead of silicon nitride for the multipurpose masking layer.

What is claimed is:

[ 1. A method of fabricating a semiconductor device comprising the steps of:

forming on the surface of the epitaxial layer of a body which includes a semiconductive epitaxial layer on a semiconductive bulk portion a first mask of a material having the characteristics that it resists etching in a first ambient which etches the semiconductor material, it inhibits oxidation of the underlying semiconductor material during a subsequent step in which the unmasked portion of the surface is oxidized, and it is removable by etching in a second ambient which attacks the mask but does not appreciably attack the grown oxide of the semiconductor material;

immersing the body in the first ambient so that the unmasked portions of the surface of the eptiaxial layer are removed by etching at least partially through the epitaxial layer to form a mesa;

exposing the body at an elevated temperature to a second ambient sufficient to oxidize the unmasked portions of the epitaxial layer for a time sufficient that the oxide grown there extends essentially completely through the epitaxial layer and planarity is substantially restored to the surface of the body;

removing the mask from the surface to expose the portions of the surface thereunderlying; and introducing impurities into the exposed semiconductor portions to modify the conductivity therein, this lastmentioned step using the aforementioned grown oxide as a second mask for enabling selective introduction of impurities into the exposed semiconductor regions.]

[ 2. A method as recited in claim 1 wherein the impurities introduced into the exposed semiconductor portions are of a type and amount sufficient to form in the mesa a plane rectifying junction which intersects the sides of the mesa where such sides are covered by the grown oxide.]

[ 3. A method as recited in claim 1 wherein the resistivity of the epitaxial layer is different from the resistivity of the bulk portion.]

[ 4. A method as recited in claim 1 wherein the material for said mask is silicon nitride.]

[ 5. The method recited in claim 1 further characterized in that the semiconductor material is silicon.]

[ 6. The method recited in claim 3 further characterized in that the material for said first mask is selected from the group consisting of silicon nitride and aluminum oxide.]

[ 7. The method recited in claim 5 further characterized in that the semiconductor body comprises a low resistivity substrate and a higher resistivity epitaxial layer thereon.]

[ 8. The method recited in claim 7 further characterized in that the introduced impurities convert at least a portion of the epitaxial layer to a zone of conductivity type opposite to that of the epitaxial layer.]

[ 9. The method recited in claim 5 wherein the silicon body includes a one micron thick N-type epitaxial layer on a thicker bulk portion, the first mask is of a material selected from the group consisting of silicon nitride and aluminum oxide, the unmasked regions are etched to a depth of about 0.7 micron, and the first mask is removed by etching in a solution of phosphoric acid maintained at about 180° C.]

[ 10. The semiconductor device fabricated according to claim 9.]

[ 11. The semiconductor device fabricated according to claim 1.]

*12. A method of fabricating a semiconductor device comprising the steps of:*

*first forming a semiconductive epitaxial layer on a semiconductive bulk portion, the bulk portion and the layer constituting a semiconductive body;*

*second forming on the surface of the epitaxial layer a first mask of a material having the characteristics that it resists etching in a first ambient which etches the semiconductor material, it inhibits oxidation of the underlying semiconductor material during a subsequent step in which the unmasked portion of the surface is oxidized, and it is removable by etching in a second ambient which attacks the mask but does not appreciably attack the grown oxide of the semiconductor material;*

*immersing the body in the first ambient so that the unmasked portions of the surface of the epitaxial layer are removed by etching at least partially*

*through the epitaxial layer to form a mesa;*

*exposing the body at an elevated temperature to a second ambient sufficient to oxidize the unmasked portions of the epitaxial layer for a time sufficient that the oxide grown there extends essentially completely through the epitaxial layer and planarity is substantially restored to the surface of the body;*

*removing the mask from the surface to expose the portions of the surface thereunderlying;*

*introducing impurities into the exposed semiconductor portions to modify the conductivity therein, this last-mentioned step using the aforementioned grown oxide as a second mask for enabling selective introduction of impurities into the exposed semiconductor regions; and*

*characterized in that:*

*1. the semiconductor material is silicon;*

*2. the first forming step produces an epitaxial silicon layer which is about one micron thick on a thicker bulk portion and which is doped differently from the bulk portion;*

*3. the first mask is of a material selected from the group consisting of silicon nitride and aluminum oxide,*

*4. the unmasked regions are etched to a depth of about 0.7 micron, and*

*5. the first mask is removed by etching in a solution of hot phosphoric acid.*

*13. A method as recited in claim 12 wherein the impurities introduced into the exposed semiconductor portions are of a type and amount sufficient to form in the mesa a plane rectifying junction which intersects the sides of the mesa where such sides are covered by the grown oxide.*

*14. A method recited in claim 13 further characterized in that the semiconductor body comprises a low resistivity substrate and a higher resistivity epitaxial layer thereon.*

*15. A method recited in claim 14 further characterized in that the introduced impurities convert at least a portion of the epitaxial layer to a zone of conductivity type opposite to that of the epitaxial layer.*

*16. A method as recited in claim 15 wherein the impurities introduced form in said zone P-type conductivity in the upper part of the mesa, an N-type zone remaining between the P-type zone and the bulk portion, and wherein electrical contacts are made to the P-type zone and the bulk portion so that the device is capable of functioning as an IMPATT diode.*

* * * * *